(12) United States Patent
Im et al.

(10) Patent No.: US 9,142,790 B2
(45) Date of Patent: Sep. 22, 2015

(54) PHOTOSENSOR AND PHOTODIODE THEREFOR

(75) Inventors: Seong Il Im, Seoul (KR); Kwang-Hyun Lee, Seongnam-si (KR)

(73) Assignees: Samsung Electronics Co., Ltd., Gyeonggi-do (KR); Industry-Academic Cooperation Foundation, Yonsei University, Seoul (KR)

( * ) Notice: Subject to any disclaimer, the term of this patent is extended or adjusted under 35 U.S.C. 154(b) by 634 days.

(21) Appl. No.: 13/350,226

(22) Filed: Jan. 13, 2012

(65) Prior Publication Data

US 2013/0026454 A1 Jan. 31, 2013

(30) Foreign Application Priority Data

Jul. 25, 2011 (KR) ........................ 10-2011-0073641

(51) Int. Cl.
| | | |
|---|---|---|
| H01L 35/24 | (2006.01) | |
| H01L 51/44 | (2006.01) | |
| H01L 51/42 | (2006.01) | |
| H01L 51/00 | (2006.01) | |
| H01L 27/28 | (2006.01) | |

(52) U.S. Cl.
CPC .......... *H01L 51/442* (2013.01); *H01L 51/4213* (2013.01); *H01L 51/447* (2013.01); *H01L 27/283* (2013.01); *H01L 51/0055* (2013.01); *Y02E 10/549* (2013.01)

(58) Field of Classification Search
CPC .................................................. H01L 51/0545
USPC .......................................................... 257/40
See application file for complete search history.

(56) References Cited

U.S. PATENT DOCUMENTS

| | | |
|---|---|---|
| 7,888,759 B2 | 2/2011 | Ihama |
| 2007/0045760 A1 | 3/2007 | Ihama |
| 2010/0187501 A1 | 7/2010 | Toda |
| 2013/0026454 A1* | 1/2013 | Lee et al. .................... 257/40 |

FOREIGN PATENT DOCUMENTS

| | | |
|---|---|---|
| JP | 06-289306 A | 10/1994 |
| JP | 2007059516 A | 3/2007 |
| JP | 2010203883 A | 9/2010 |
| KR | 20100088077 A | 8/2010 |

OTHER PUBLICATIONS

Sidelobe Reduction of Low-Profile Array Antenna Using a Genetic Algorithm, Son et al., ETRI journal, 22, 95 (2007).
"a-Si: H photodiode technology for advanced CMOS active pixel sensor images", Theil et al., Journal of Non-crystalline Solids 299, 1234 (2002).
"An Organic Active-Matrix Imager", Nausieda et al., IEEE Transactions on Electron Devices 55, 527 (2008).
"A monolithically integrated organic photodetector and thin film transistor", Renshaw et al., Organic Electronics 11, 175 (2010).

(Continued)

*Primary Examiner* — Jack Chen
(74) *Attorney, Agent, or Firm* — Harness, Dickey & Pierce, P.L.C.

(57) ABSTRACT

According to example embodiments, a photodiode includes a photoelectric layer on a first electrode, a second electrode on the photoelectric layer, and a first phosphorescence layer on the second electrode.

20 Claims, 22 Drawing Sheets
(2 of 22 Drawing Sheet(s) Filed in Color)

(56) References Cited

OTHER PUBLICATIONS

"Integration of Organic FETs With Organic Photodiodes for a Large Area, Flexible, and Lightweight Sheet Image Scanners", Someya et al., IEEE Transactions on Electron Devices 52, 2502 (2005).

"An Almost Transparent Image Pixel with a Pentacene/ZnO Photodiode, a Pentacene Thin-Film Transistor, and a 6,13—Pentacenequinone Phosphor Layer", Lee et al., Advanced Materials, 23, 1231-1236, (2011).

"Semi-transparent organic/inorganic hybrid photo-detector using pentacene/ZnO diode connected to pentacene transistor", Lee et al., Organic Electronics, 12, 1103-1107 (2011).

* cited by examiner

PHOTOSENSOR AND PHOTODIODE THEREFOR

CROSS-REFERENCE TO RELATED APPLICATION

This application claims priority under 35 U.S.C. §119 to the benefit of Korean Patent Application No. 10-2011-0073641, filed in the Korean Intellectual Property Office on Jul. 25, 2011, the entire contents of which are incorporated herein by reference.

BACKGROUND

1. Field

Example embodiments relate to a photodiode and/or a photosensor including a photodiode.

2. Description of the Related Art

Transparent electronics based on organic semiconductors and oxide semiconductors are being studied. For example, concept and basic studies for transparent display devices and transparent smart windows are being studied as core applications of the field. Although the smart windows may be installed and operated like ordinary windows of a building or a structure, the smart windows may be a human-friendly electronic system or complex including various devices such as display devices, circumstance-detecting sensors, etc. Main devices for this application include a driving thin film transistor, a memory, and an operating circuit.

However, the study of transparent circumstance-detecting sensors and devices is not dominant although the photosensors may play a significant role since the smart windows are also a kind of windows and thus almost always exposed to light. In addition, glass that may be treated at a low temperature equal to or lower than about 500° C. is mainly used as a substrate for the transparent electronics and thus a conventional silicon processes may not be applied to the glass substrate.

SUMMARY

According to example embodiments, a photodiode includes a photoelectric layer on a first electrode, a second electrode on the photoelectric layer, and a first phosphorescence layer on the photoelectric layer.

The photoelectric layer, the first and second electrodes, and the first phosphorescence layer may be one of transparent and translucent.

The first phosphorescence layer may include pentacene-quinone.

The photoelectric layer may include a p-type layer including a p-type organic semiconductor, and an n-type layer including an n-type inorganic semiconductor, wherein the p-type layer and the n-type layer form a junction.

The p-type layer may include pentacene.

The n-type layer may include zinc oxide (ZnO).

The photodiode may further include a second phosphorescence layer. The first electrode may be on the second phosphorescence layer.

The second electrode may include nickel oxide ($NiO_x$).

The first electrode may include at least one of indium-tin-oxide (ITO) and indium-zinc-oxide (IZO).

According to example embodiments, a photosensor may include a driving transistor connected to a photodiode. The photodiode may include a first electrode, a photoelectric layer on the first electrode, a second electrode on the photoelectric layer, and a phosphorescence layer on the photoelectric layer.

The photodiode and the driving transistor may be one of transparent and translucent.

The first phosphorescence layer may include pentacene-quinone.

The photoelectric layer may include a p-type layer including a p-type organic semiconductor and an n-type layer including an n-type inorganic semiconductor. The p-type layer and the n-type layer may form a junction.

The p-type layer may include pentacene.

The n-type layer may include zinc oxide (ZnO).

The second electrode may include nickel oxide ($NiO_x$).

The first electrode may include at least one of indium-tin-oxide (ITO) and indium-zinc-oxide (IZO).

The driving transistor may include a gate electrode, a gate insulating layer on the semiconductor layer, a semiconductor layer on the gate insulating layer, and source and drain electrodes contacting the semiconductor layer. The semiconductor layer may include pentacene. The source electrode may be connected to the first electrode.

The gate electrode and the first electrode may include a first material in common, and the source and drain electrodes and the second electrode may include a second material in common.

The gate insulating layer may include $AlO_x$.

BRIEF DESCRIPTION OF THE DRAWINGS

The patent application or application file contains at least one drawing executed in color. Copies of this patent or patent application publication with color drawing(s) will be proved by the Office upon request and payment of the necessary fee.

The foregoing and other features and advantages of example embodiments will be apparent from the more particular description of non-limiting example embodiments, as illustrated in the accompanying drawings in which like reference characters refer to the same parts throughout the different views. The drawings are not necessarily to scale, emphasis instead being placed upon illustrating the principles of inventive concepts. In the drawings.

DETAILED DESCRIPTION

Figure 1:
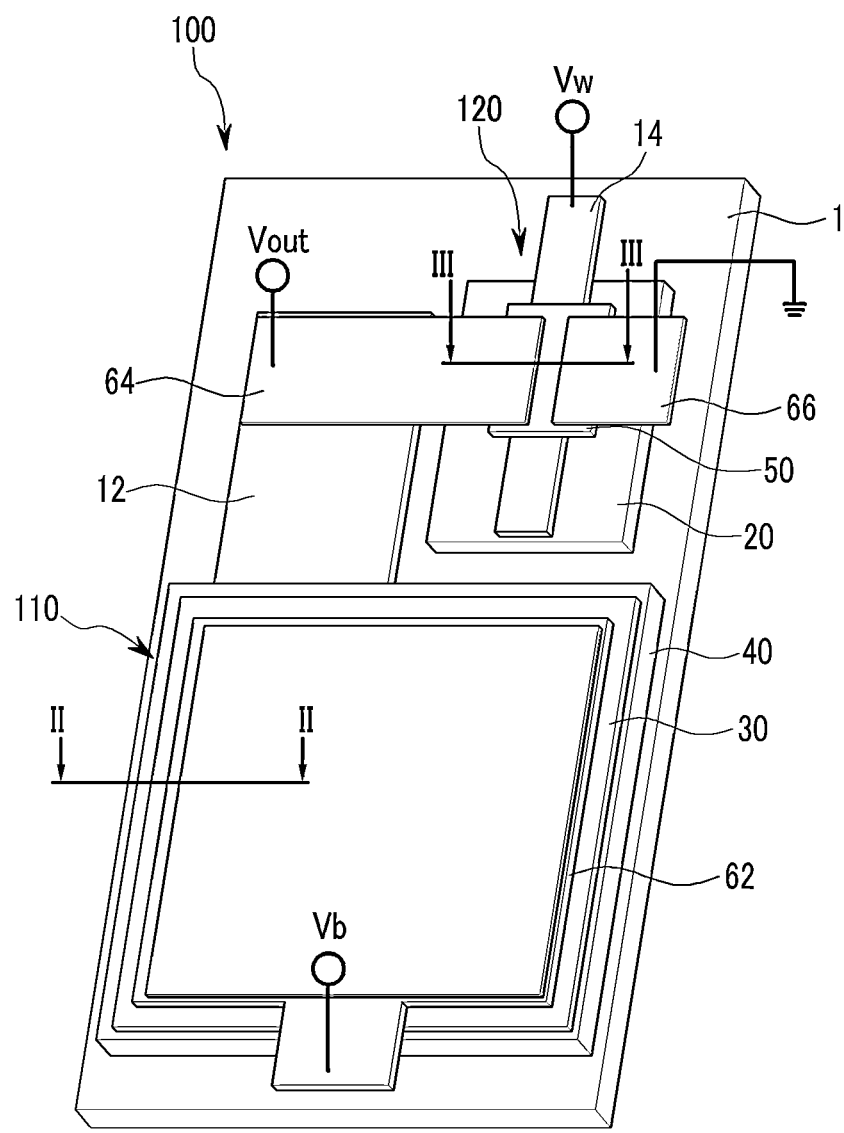
FIG. 1 is a schematic perspective view of a photosensor according to example embodiments.

Example embodiments will be described more fully hereinafter with reference to the accompanying drawings. Example embodiments, may, however, be embodied in many different forms and should not be construed as being limited to the embodiments set forth herein; rather, these example embodiments are provided so that this disclosure will be thorough and complete, and will fully convey the scopes of example embodiments of inventive concepts to those of ordinary skill in the art. In the drawings, the thicknesses of layers and regions are exaggerated for clarity. As those skilled in the art would realize, the described embodiments may be modified in various different ways, all without departing from the spirit or scope. In the drawing, parts having no relationship with the explanation are omitted for clarity, and the same reference numerals designate the same elements throughout the specification.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

A photosensor according to example embodiments is described in detail with reference to FIG. 1 to FIG. 4.

Figure 2:
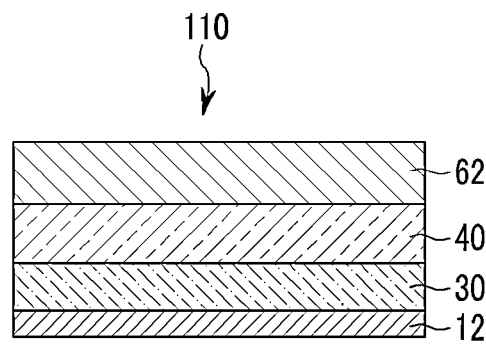
FIG. 2 is a sectional view of the photosensor shown in FIG. 1 taken along line II-II.
Figure 3:
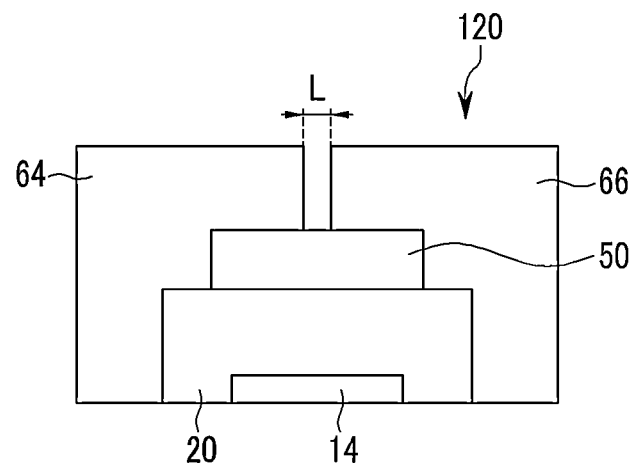
FIG. 3 is a sectional view of the photosensor shown in FIG. 1 taken along line III-III.

FIG. 1 is a schematic perspective view of a photosensor according to example embodiments. FIG. 2 is a sectional view of the photosensor shown in FIG. 1 taken along line II-II. FIG. 3 is a sectional view of the photosensor shown in FIG. 1 taken along line FIG. 4 is an equivalent circuit diagram of the photosensor shown in FIG. 1.

Figure 4:
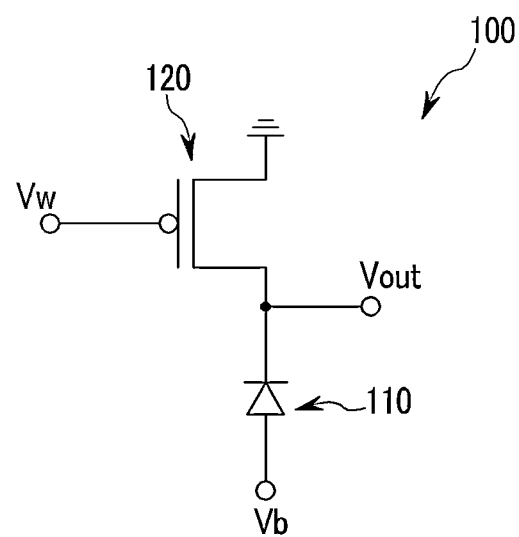
FIG. 4 is an equivalent circuit diagram of the photosensor shown in FIG. 1.

Referring to FIG. 1 and FIG. 4, a photosensor 100 according to example embodiments includes a photodiode 110 disposed on a substrate 1 and a driving transistor 120. The photodiode 110 may generate current upon receipt of light, and the driving transistor 120 may stay in turn-off state in absence of light but turn on upon receipt of light to transmit the current generated by the photodiode 110 to an output terminal. The photosensor 100 may be transparent or translucent.

The substrate 1 may include a transparent insulating material such as glass.

Referring to FIG. 1 and FIG. 2, the photodiode 110 may include a lower electrode 12, an n-type layer 30, a p-type layer 40, and the upper electrode 62, which are deposited in sequence from bottom.

The p-type layer 40 may include a p-type organic semiconductor, and the n-type layer 30 may include an n-type inorganic semiconductor. An example of the p-type organic semiconductor may be pentacene, etc., and an example of the n-type inorganic semiconductor may be zinc oxide (ZnO), etc. The p-type layer 40 and the n-type layer 30 may be transparent or translucent. A junction of a p-type organic pentacene semiconductor and an n-type ZnO semiconductor may be formed by low temperature process. Hereinafter, the combination of the p-type layer 40 and the n-type layer 30 may be referred to as a "photoelectric layer" sometimes.

The lower electrode 12 may include a transparent material such as indium-tin-oxide (ITO) or indium-zinc-oxide (IZO), etc.

The upper electrode 62 may also include a transparent material such as $NiO_x$. $NiO_x$ may be deposited without giving damage to underlayers and may increase the transparency of the photodiode 110.

Referring to FIG. 1 and FIG. 3, the driving transistor 120 may be a thin film transistor including the gate electrode 14, the gate insulating layer 20, the semiconductor layer 50, and the source and drain electrodes 64 and 66, which are deposited in sequence. The source and drain electrode 64 and 66 are separated by a length L. The length may be about 90 µm, but example embodiments are not limited thereto.

The semiconductor layer 50 may include an organic semiconductor, for example, pentacene. The semiconductor layer 50 may be transparent or translucent.

The gate insulating layer 20 may include a transparent or translucent insulating material, for example, $AlO_x$.

The gate electrode 14 and the source and drain electrodes 64 and 66 may include a transparent conductive material. For example, the gate electrode 14 may include ITO, etc., and the source and drain electrodes 64 and 66 may include $NiO_x$, etc.

The source electrode 64 may be connected to the lower electrode 12 of the photodiode 110.

The photosensor with pentacene may be transparent or translucent, but also sensitive to visible light from all directions to operate.

FIG. 4 is an equivalent circuit diagram of the photosensor shown in FIG. 1. Referring to FIG. 4, Vw refers to a wordline voltage of the driving transistor 120. Vb refers to a bitline voltage of the photodiode 110. Vout refers to an output voltage of the photosensor 110.

Next, a photodiode according to example embodiments is described in detail with reference to FIGS. 5 and 24.

Figure 5:
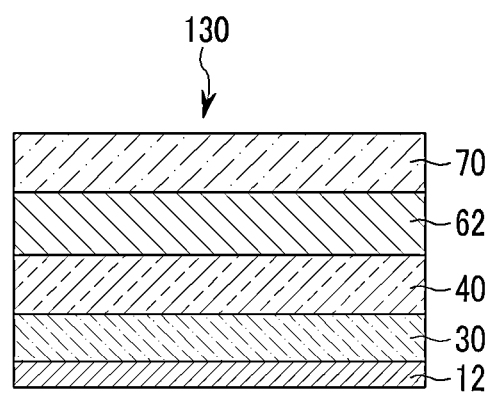
FIG. 5 is a schematic sectional view of a photodiode according to example embodiments.

FIG. 5 is a schematic sectional view of a photodiode according to example embodiments.

Referring to FIG. 5, a photodiode 130 according to example embodiments may have a cross-section similar to that of the photodiode 110 shown in FIG. 2. However, a photodiode 130 according to example embodiments further includes a phosphorescence layer 70 disposed on the photodiode 110 shown in FIG. 2.

Although FIG. 5 shows a single phosphorescence layer 70 that is disposed on one side of the photodiode 110 shown in FIG. 2, another phosphorescence layer (not shown) may be added to another side of the photodiode 110 shown in FIG. 2. The photodiode 130 according to example embodiments may be applied to the photosensor 110 shown in FIG. 1 instead of the photodiode 110 shown in FIG. 2.

The phosphorescence layer 70 may include a phosphorescence material, for example, pentacenequinone, etc. The phosphorescence material may emit light upon receipt of light, for example, X-ray.

On the contrary, the photodiode 110 shown in FIG. 2 may possibly be responsive to visible light but not to non-visible light such as X-ray. However, upon the application of the photodiode 130 shown in FIG. 5, the phosphorescence layer 70 may receive X-ray to generate visible light that may be yellow, and the generated light may be received by the junction of the p-type layer 40 and the n-type layer 30 that may generate current. Therefore, the photodiode 130 may be sensitive to non-visible light such as X-ray.

For example, the phosphorescence layer 70 may include 6,13-pentacenequinone. The gap between highest occupied molecular orbital (HOMO) and lowest unoccupied molecular orbital (LUMO) of 6,13-pentacenequinone may be about 2.7 eV, and thus the phosphorescence layer 70 may absorb violet to ultraviolet, X-ray, etc., having higher energy and emit yellow light with wavelength of about 580 nm.

If the junction of the p-type layer 40 and the n-type layer 30 directly absorbs light of ultraviolet range, the junction may be filled with fixed defect charges that causes signal delay, or the pentacene of the p-type layer 40 may be oxidized. The phosphorescence layer 70 may absorb ultraviolet light prior to the junction, and substitute the absorbed ultraviolet light with yellow light, thereby reducing and/or preventing the damage on the underlying organic and oxide thin films.

In addition, the yellow light emitted from the photodiode 130 may serve as a visible signal indicating that the ultraviolet light is being absorbed.

Figure 24:
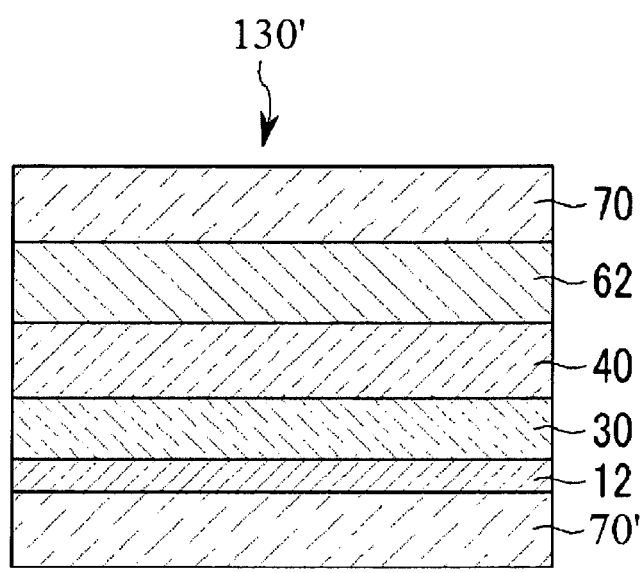
FIG. 24 is a schematic sectional view of a photodiode according to example embodiments.

FIG. 24 is a schematic sectional view of a photodiode according to example embodiments.

Referring to FIG. 24, a photodiode 130' according to example embodiments may have a cross-section similar to that of the photodiode 130 shown in FIG. 5. However, a photodiode 130' according to example embodiments further includes a second phosphorescence layer 70' disposed below the lower electrode 12. The lower electrode 12 may be on the second phosphorescence layer 70'.

Now, experimental examples are described in detail with reference to FIG. 6 to FIG. 23.

First, an experimental example of the photosensor 100 shown in FIG. 1 to FIG. 3 is described in detail.

An ITO layer (not shown) was deposited on a glass substrate 1 and then the substrate was cleaned with acetone, methanol, and deionized water. The ITO layer was patterned by photolithography with an etchant (LCE-12K, CYANTEK CORPORATION) to form a lower electrode 12 of a photodiode 110 and a gate electrode 14 of a driving transistor 120.

Thereafter, an n-type layer 30 with a thickness of about 40 nm was formed by 100 W radio frequency (RF) magnetron sputtering using a mask and a ZnO target of about 99.999%. The sputtering was performed at a room temperature under a circumstance of about 6:1 $Ar+O_2$ gas mixture and a pressure of about 10 mTorr.

A gate insulating layer 20 with a thickness of about 100 nm was formed by RF magnetron sputtering using a mask and an $Al_2O_3$ target of about 99.99% under a circumstance of Ar gas with a pressure of about 20 mTorr.

Pentacene (manufactured by Aldrich Chem. Co.; purity of about 99%) was deposited by thermal evaporation with a mask at a room temperature to form a p-type layer 40 with a thickness of about 150 nm, and a semiconductor layer 50 with a thickness of about 50 nm was formed by a process similar to that used to form the p-type layer 40. The deposition rate of the pentacene was about 1 Å/s.

An upper electrode 62 and source and drain electrodes 64 and 66 including a $NiO_x$ layer (having an energy bandgap of about 4.0 eV, transmittance of about 30%, and sheet resistance of about 100Ω/☐)) with a thickness of about 100 nm were formed by thermal evaporation of NiO powder (having purity of about 99.97%) with a mask.

A thin film transistor 120 formed as described above had a width-to-length (W/L) ratio was about 500/90 microns (µm).

Since the transparency and the absorbance of visible light of a thin film are contradictory properties, experiments for finding optimum thickness of an organic layer were performed in manufacturing a device.

After measuring transparency of actual pentacene thin films, the function $F=\eta T=(1-e^{-\alpha t})e^{-\alpha t}$ was simulated to establish an optimum thickness of about 150 nm. Here, η is quantum efficiency that reflects absorbance, T is transparency, α is absorption coefficient, and t is thickness.

In detail, from dF/dt=0, a maximum of the function F ($F_{max}$) and an optimum value of αt (($\alpha t)_{op}$) were calculated. That is, $F_{max}$=0.25 and $(\alpha t)_{op}$=0.69.

Figure 6:
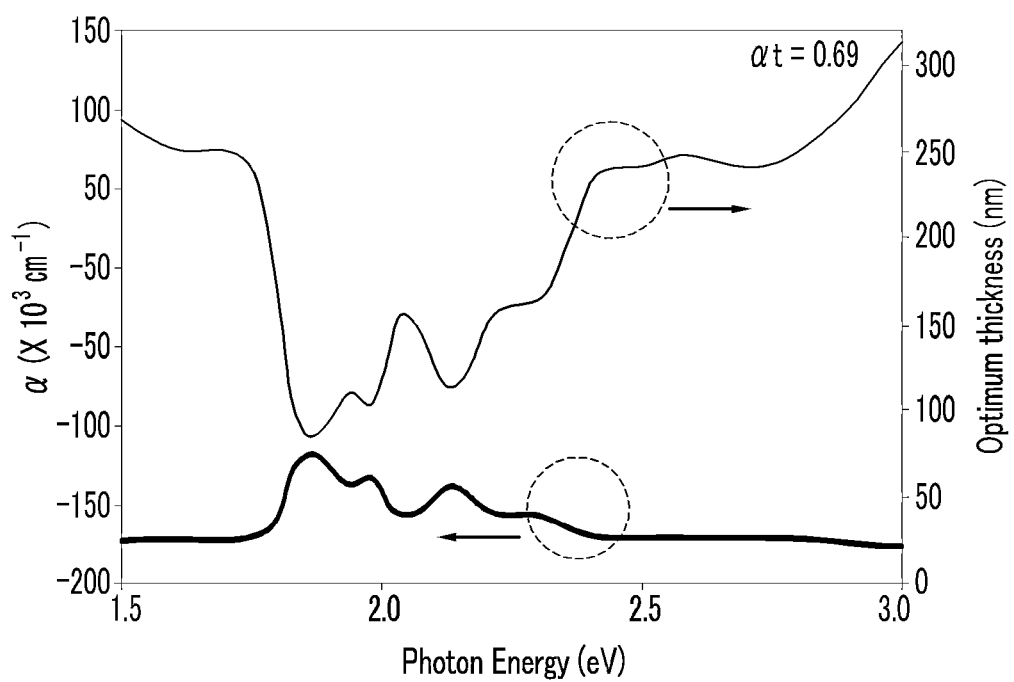
FIG. 6 to FIG. 9 are graphs that illustrates finding optimum conditions for transparency and light absorbance of an organic pentacene thin film.
Figure 7:
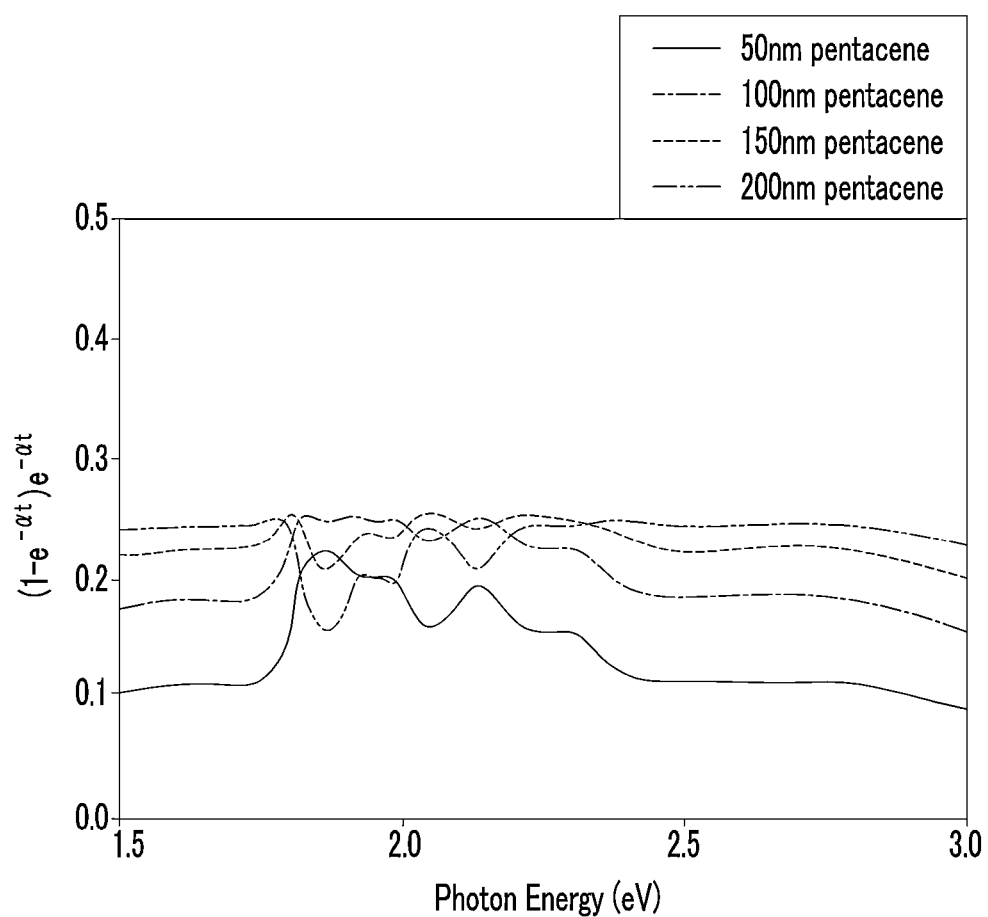
Figure 8:
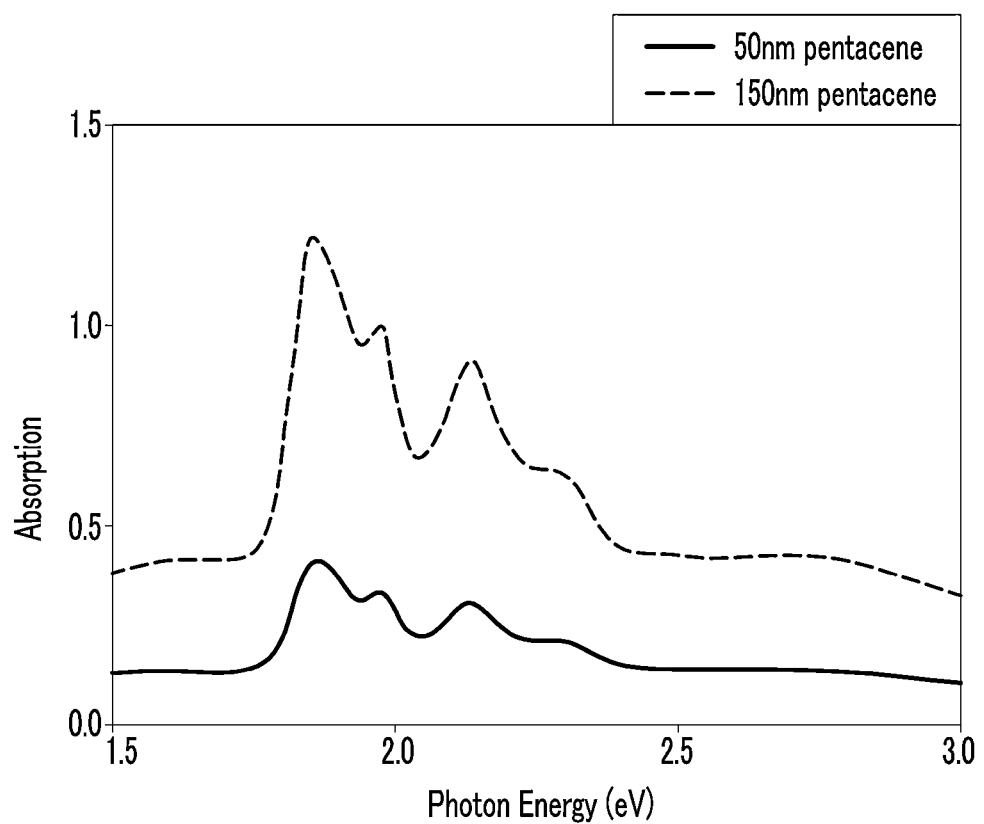
Figure 9:
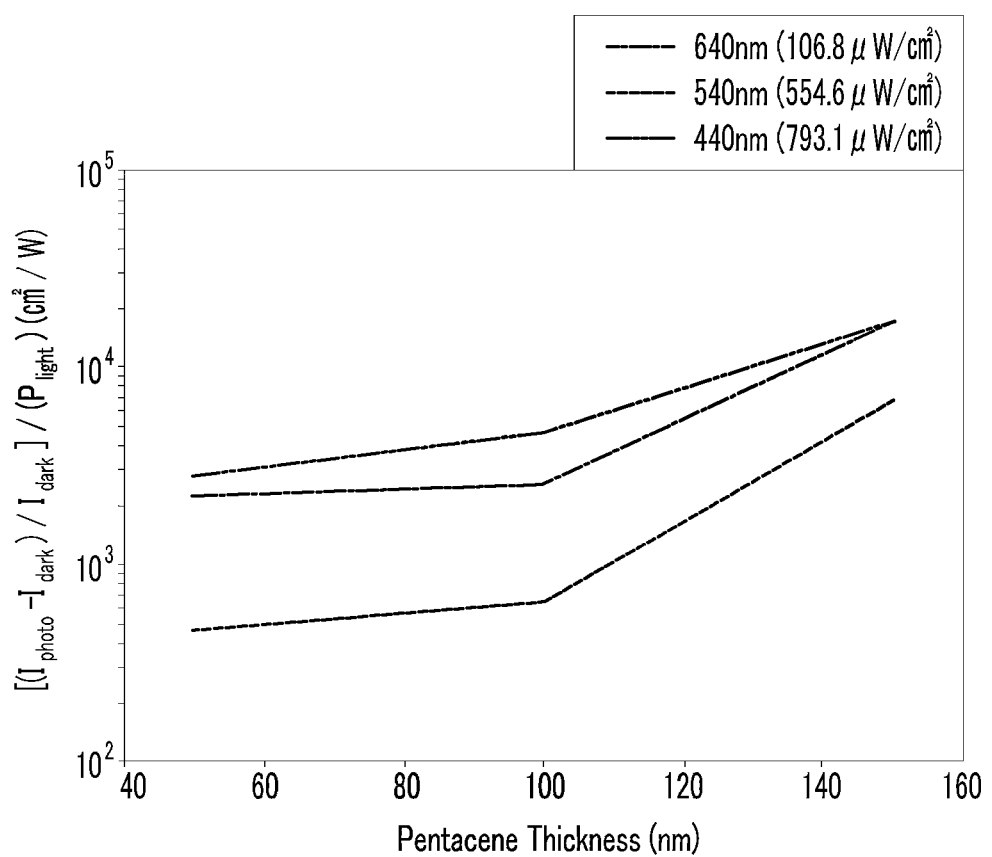

FIG. 6 to FIG. 9 are graphs that illustrates finding optimum conditions for transparency and light absorbance of an organic pentacene thin film. FIG. 6 shows absorbance and optimum film thickness for αt =0.69, as function of photon energy of incident light. FIG. 7 shows the function $F=(1-e^{-\alpha t})e^{-\alpha t}$ for various film thickness as function of photon energy of incident light, and FIG. 8 shows absorbance for the film thickness of about 50 nm and about 150 nm as function of photon energy of incident light. FIG. 9 shows photocurrent gain of a photodiode for various wavelength of incident light as function of thickness of a pentacene film.

It was seen that the photocurrent ratio for visible light increased as the thickness of the device increased. However, the increase of the thickness reduced the transparency.

Figure 10:
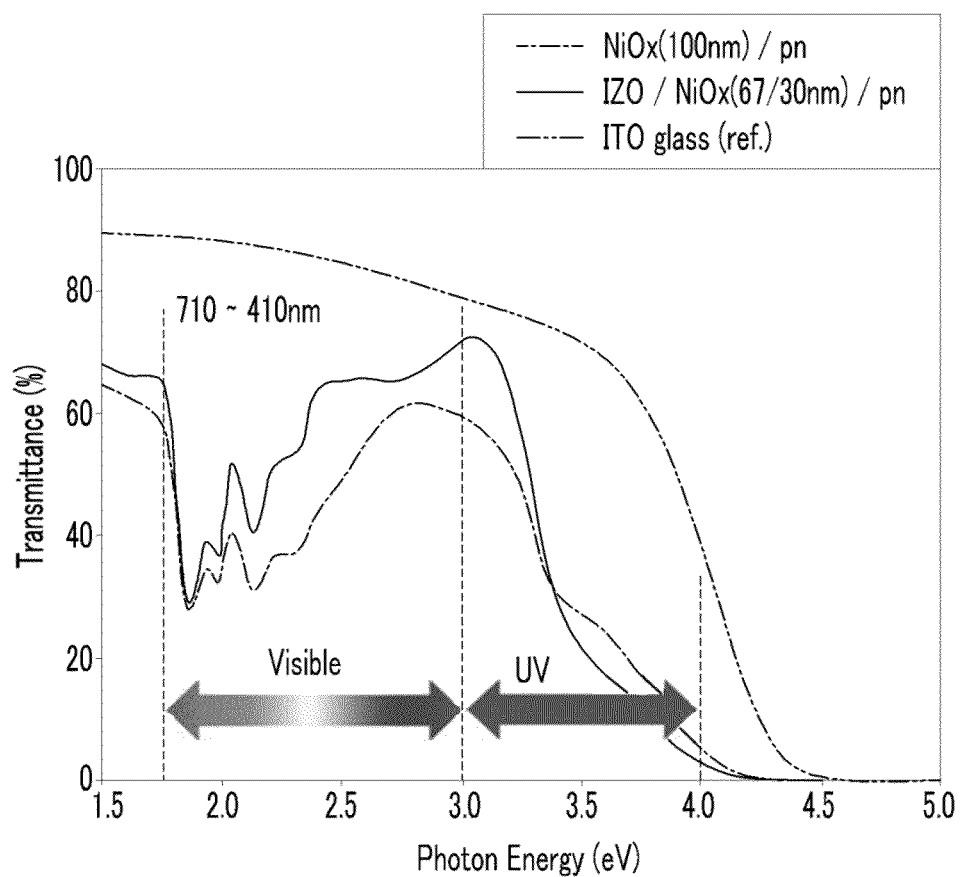
FIG. 10 is a graph showing transmittance of a photodiode with $NiO_x$ and IZO/$NiO_x$ electrode having improved transmittance.

FIG. 10 is a graph showing transmittance of a photodiode with $NiO_x$ and $IZO/NiO_x$ electrode having improved transmittance. The transmittance of this optimized structure for visible light was about 40% to about 60%.

Figure 11:
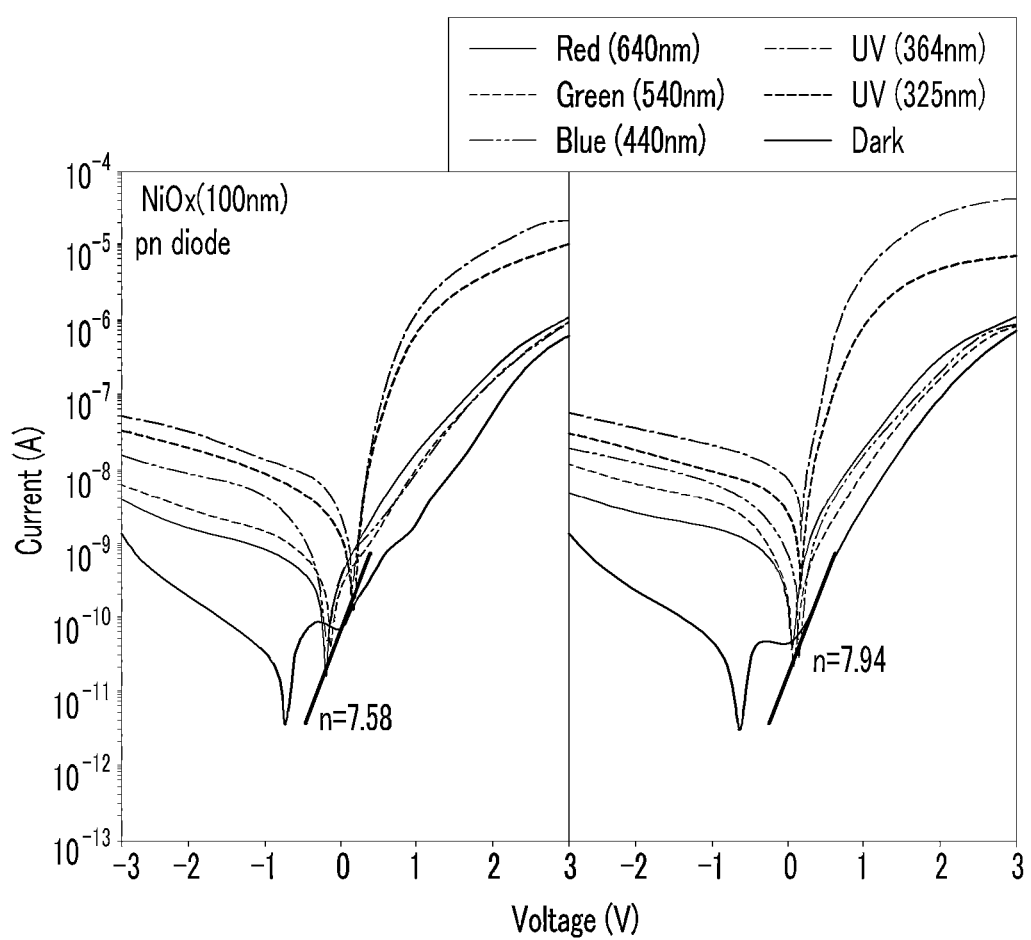
FIG. 11 is a graph illustrating photocurrent characteristics of translucent and transparent photodiodes according to photoenergy.

FIG. 11 is a graph illustrating photocurrent characteristics of translucent and transparent photodiodes according to photoenergy. The photodiode with a more transparent IZO/NiOx electrode generates more currents in visible and ultra violet regions. For inverse voltages, the photocurrent ratio for ultraviolet regions was about 50 to the maximum. The ideality factor, n, a current characteristic indicator of a diode, was about 7.5.

Figure 12:
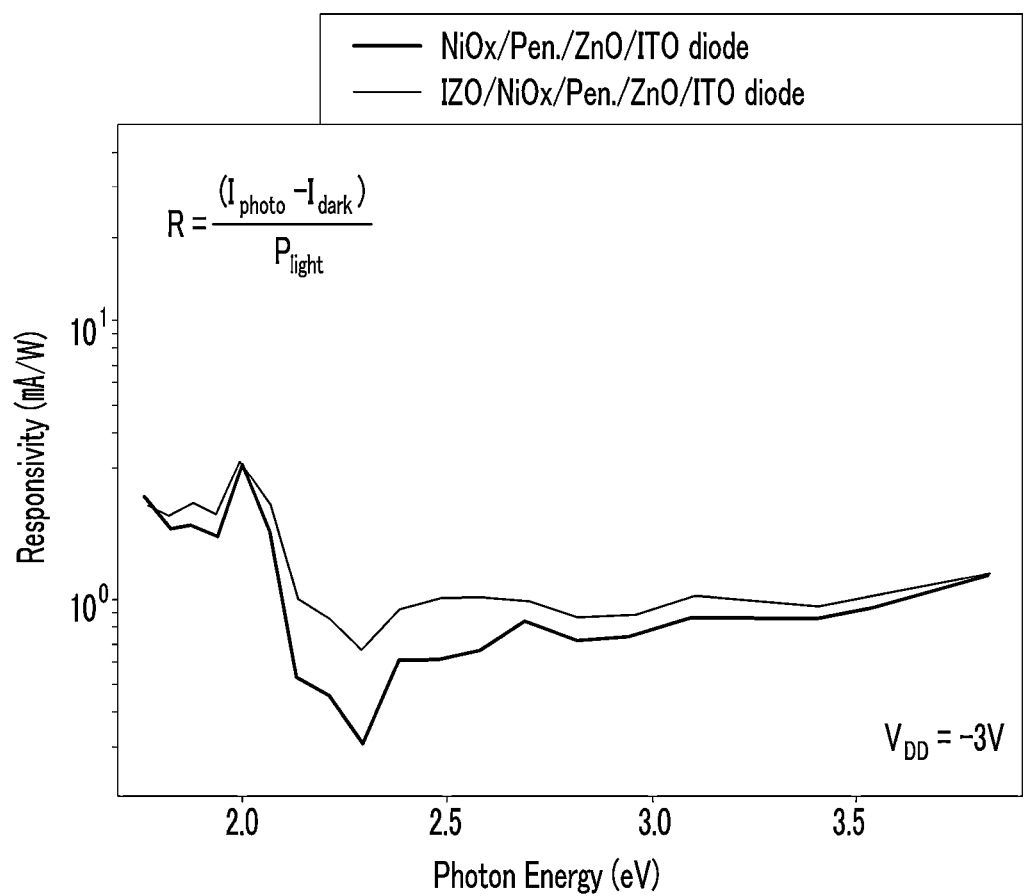
FIG. 12 is a graph showing a responsivity, a formula, and a band diagram of a photodiode for light of a given wavelength.

FIG. 12 is a graph showing a responsivity, a formula, and a band diagram of a photodiode for light of a given wavelength. The responsivity is about 3 mA/W for the photon energy of about 2.0 eV (i.e., red light) that was close to the HOMO-LUMO gap of pentacene. The responsivity slightly increases near about 2.5 eV (i.e., green light), which is supposed to related to the defect energy band of ZnO.

Figure 13:
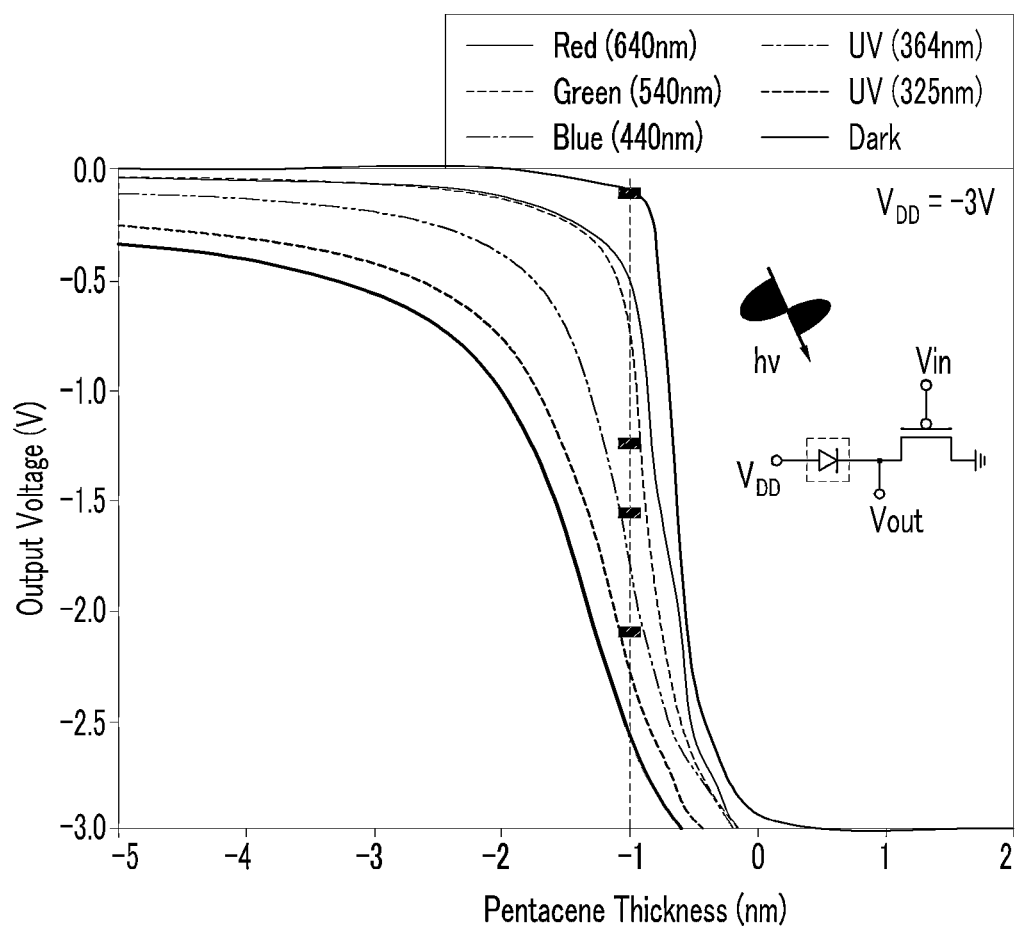
FIG. 13 and FIG. 14 show static and dynamic characteristics of an output voltage of a passive type pixel including a photodiode and a pentacene driving transistor.
Figure 14:
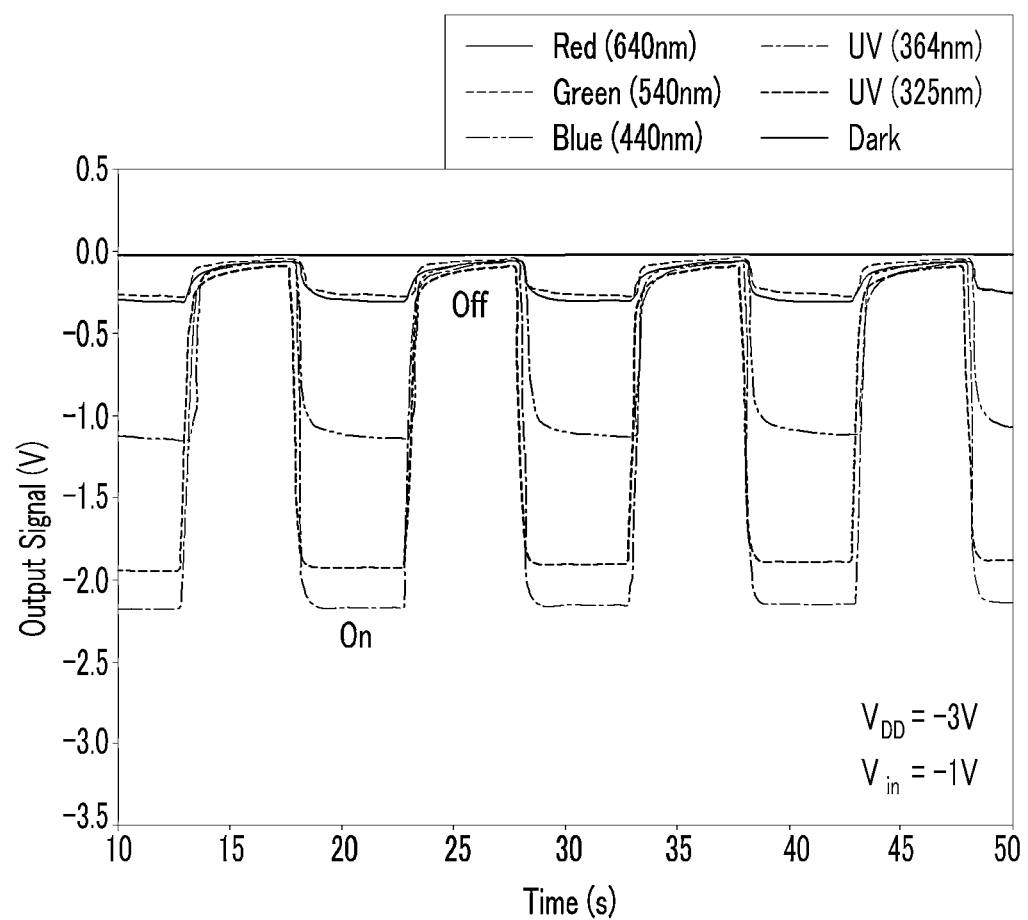
Figure 15:
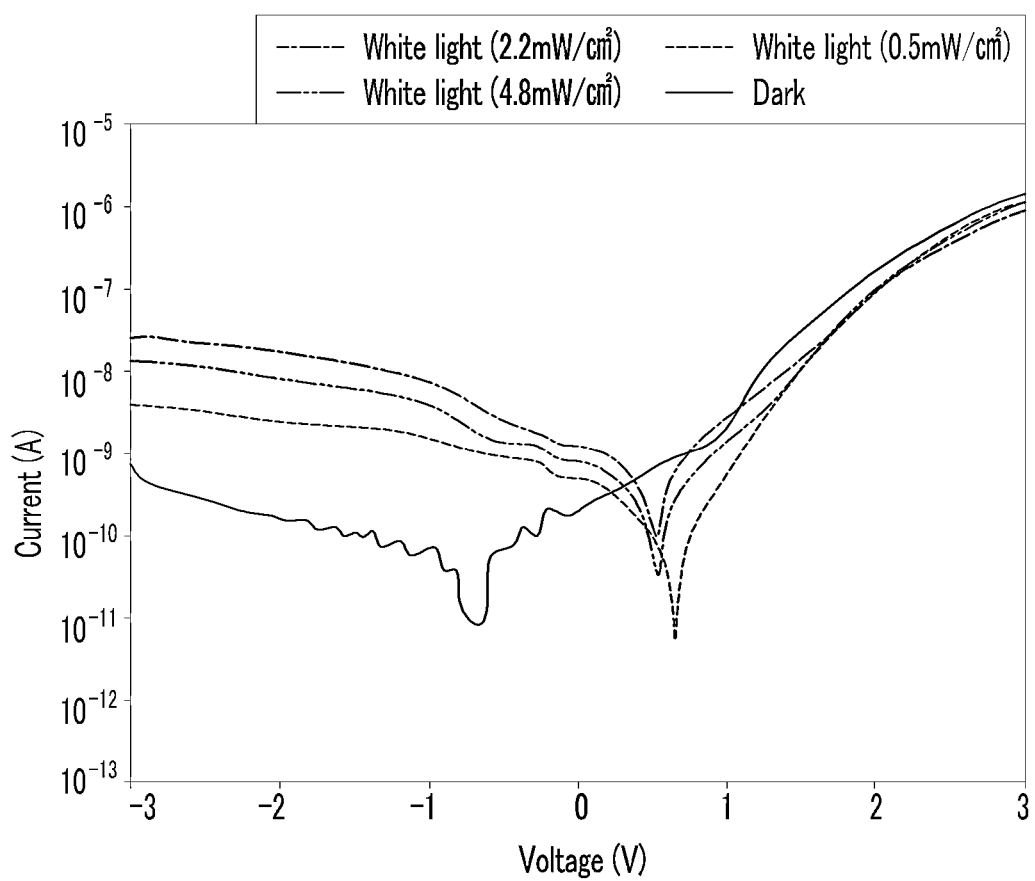
FIG. 15 to FIG. 18 are graphs showing photocurrent characteristics of a photodiode and a driving transistor under white light, and output voltage and output current of a passive pixel under successive photo switching.

FIG. 13 and FIG. 14 show static and dynamic characteristics of an output voltage of a passive type pixel including a photodiode and a pentacene driving transistor. Since the driving voltage of the pixel is negative, the photodiode operates under reverse bias. The pentacene transistor has a p-type semiconductor channel, and thus its current increases under negative drain voltage. In consideration of the current driving characteristics of the photodiode and the transistor, when the photodiode and the transistor were connected in series and only the photodiode was exposed to light, a photocurrent was produced as shown in FIG. 13 and FIG. 14 and the resistance of the photodiode was reduced. At this time, since the driving mode of the transistor is almost in a linear region, the resistance of the transistor is nearly constant. Therefore, with the resistance of the photodiode, the driving voltage $V_{DD}$ is read as the output voltage. In addition, since (the resistance of the photodiode decreases and) the current of the photodiode increases as the photon energy increases, an increased driving voltage is read as the output voltage increases. Based on this principle, the output voltage may be different for different wavelengths of incident light and thus the signals for the different wavelengths can be differentiated. Reference character Vin in FIG. 13 refers to an input voltage of the transistor.

Referring to FIG. 14, the signal differences may be clearly shown for dynamic on-off of light, and a slight signal delay may be shown in absence of incident light due to the area and the hidden capacitive component of the transparent photodiode.

Figure 16:
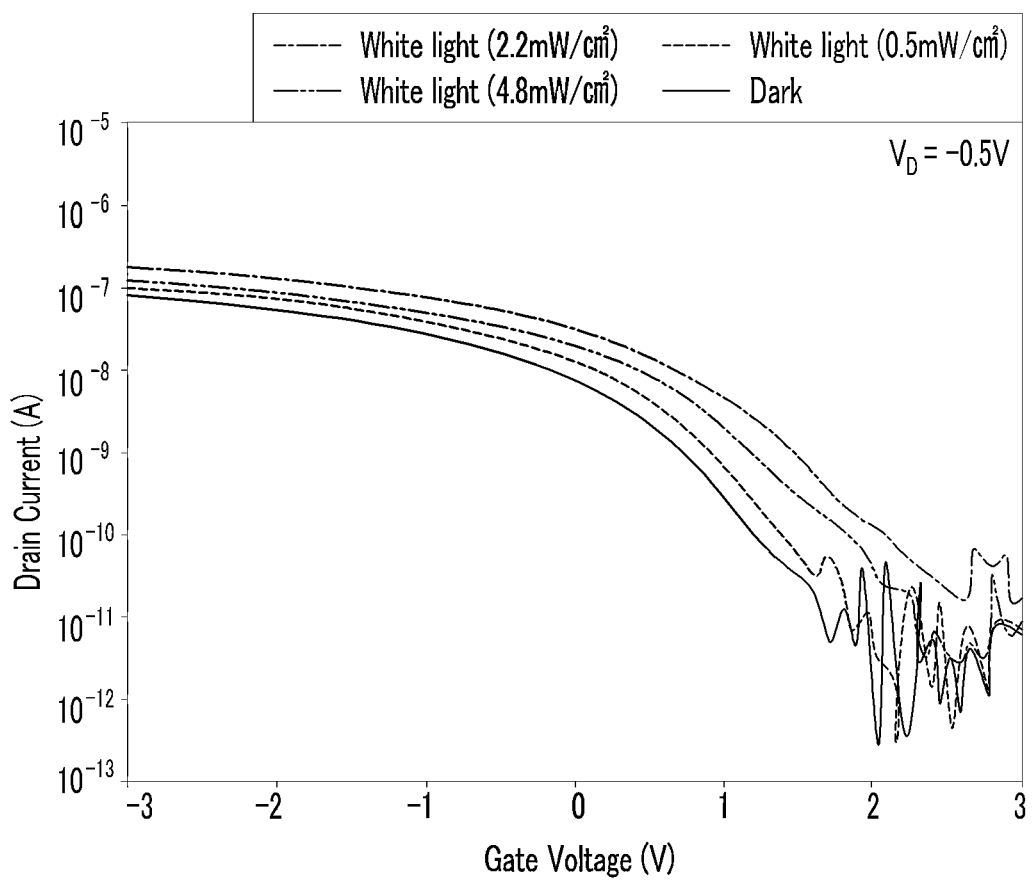

FIG. 15 to FIG. 18 are graphs showing photocurrent characteristics of a photodiode and a driving transistor under white light, and output voltage and output current of a passive pixel under successive photo switching. The photocurrent increased under reverse bias as the energy density of the white light increased. In FIG. 16, $V_D$ refers to the drain voltage.

Figure 17:
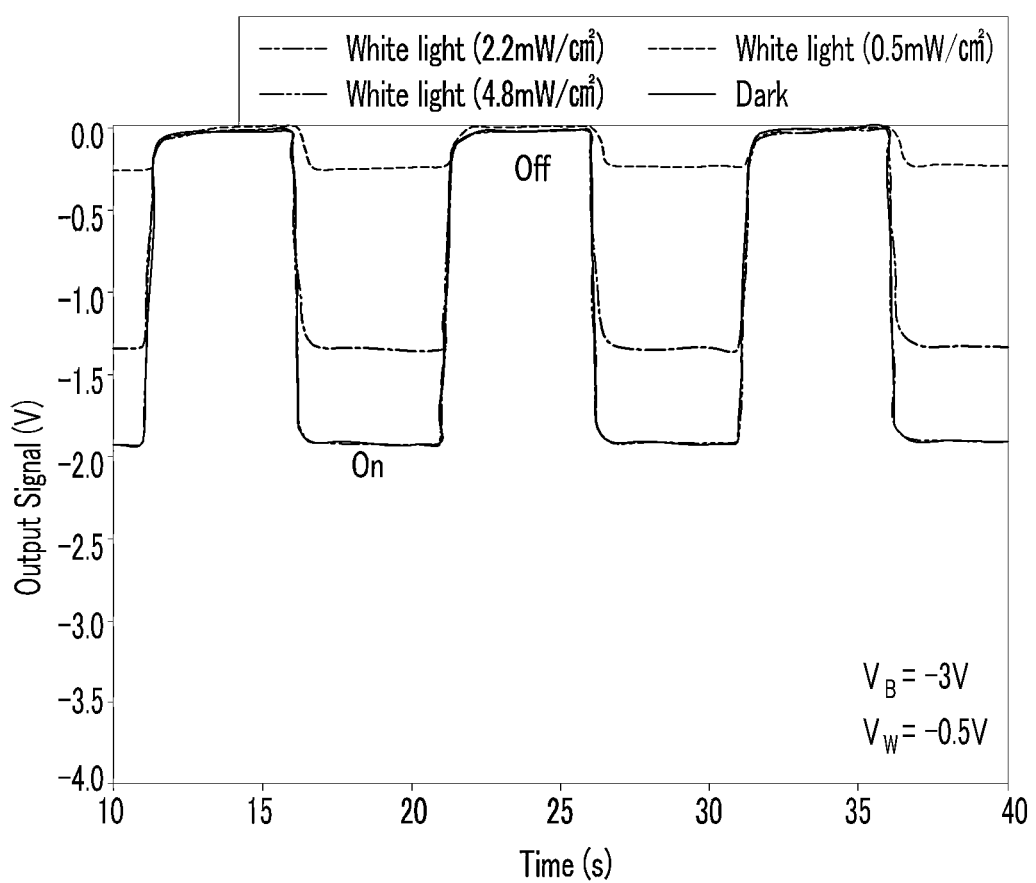
Figure 18:
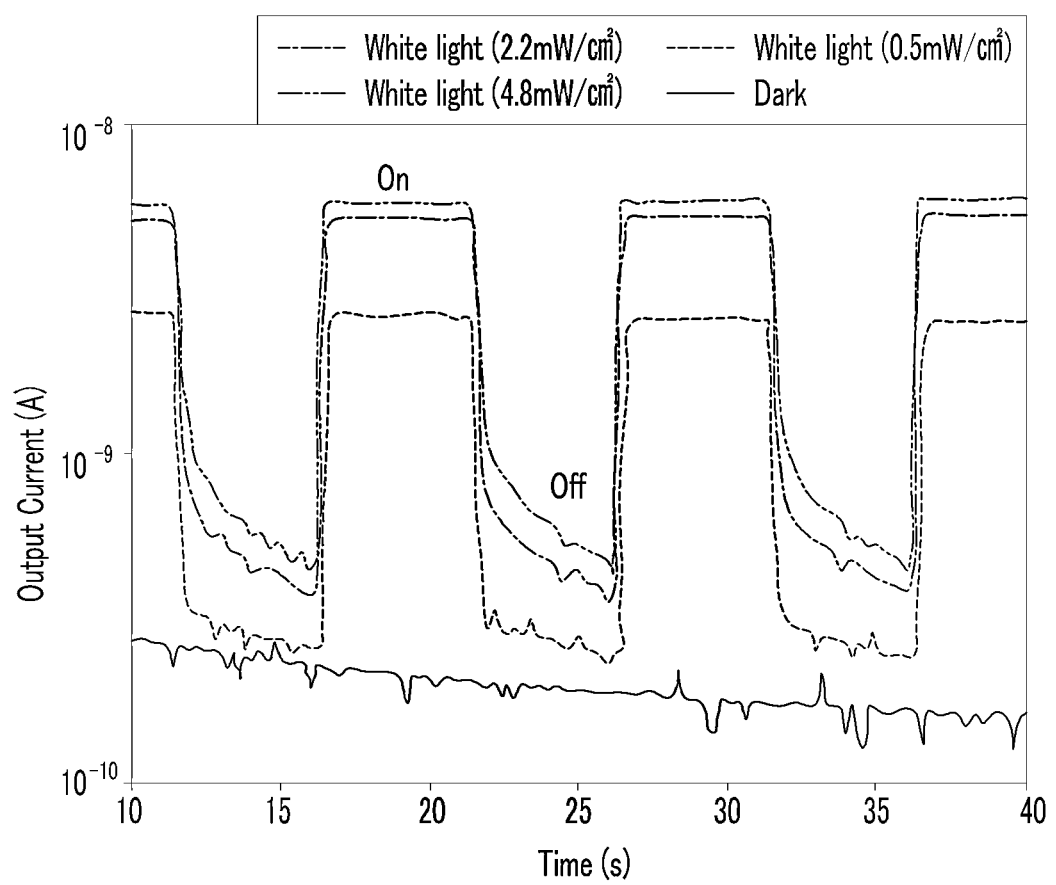

Referring to FIG. 17 and FIG. 18, the dynamic characteristics of the output voltage and the output current were also measured under white-light switching. The output voltage for a low voltage of about −3 V was about ⅔ of a maximum voltage, and the photo-induced voltage delay was equal to or less than about one second. This shows that a junction of a photodiode and a thin film transistor for amplification may serve as a sensor for detecting external circumstances.

Figure 19:
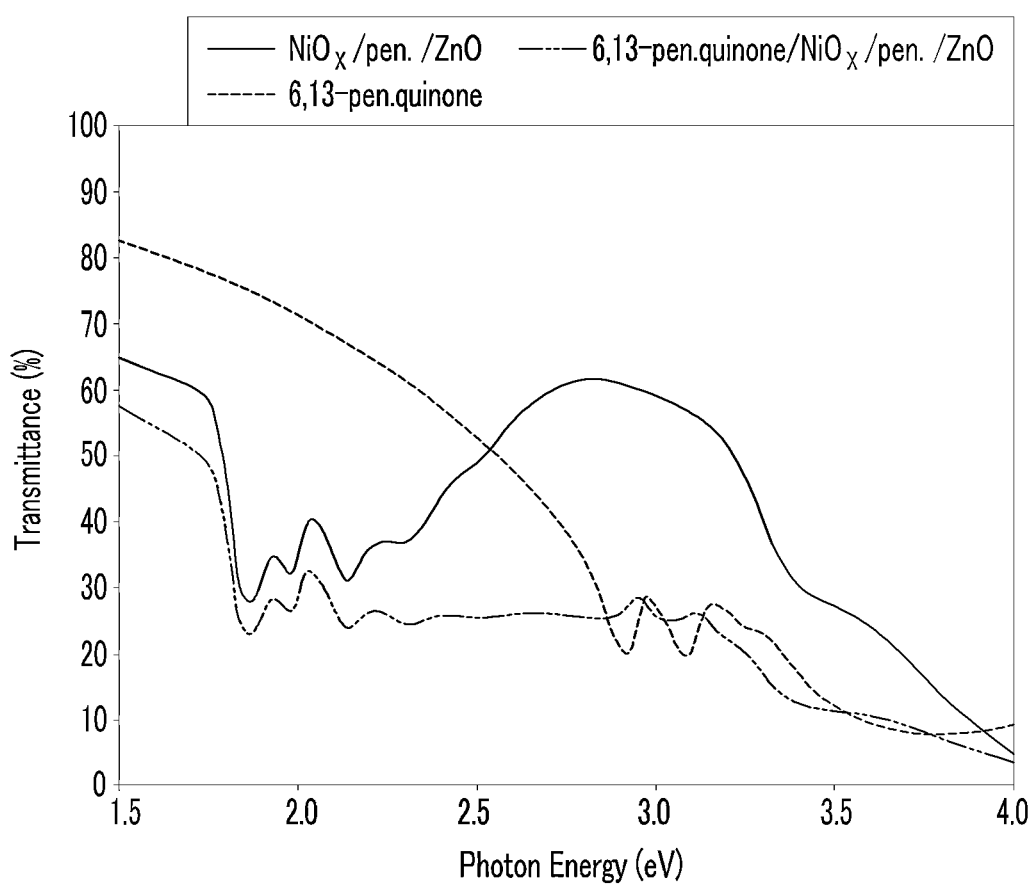
FIG. 19 is a graph showing transmittance of a device that was made by depositing a pentacenequinone phosphorescence layer emitting yellow phosphorescence on the previously fabricated photosensor as shown in FIG. 5.

FIG. 19 is a graph showing transmittance of a device that was made by depositing a pentacenequinone phosphorescence layer 70 emitting yellow phosphorescence on the previously fabricated photosensor as shown in FIG. 5, thereby improving photo efficiency. The transmittance decreased slightly due to the light absorption of the pentacenequinone phosphorescence layer. The optical HOMO-LUMO gap of pentacenequinone was evaluated as about 2.7 eV using the transmittance graph.

Figure 20:
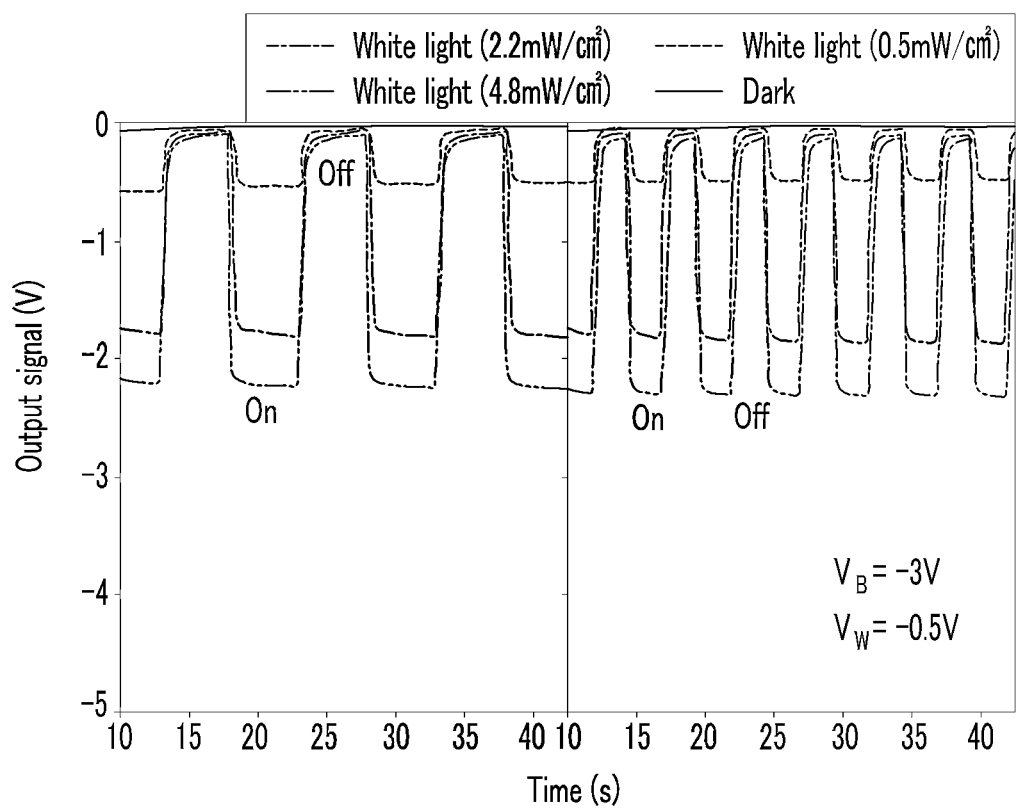
FIG. 20 is a graph showing output voltage characteristics of a photosensor including a photodiodes shown in FIG. 5.
Figure 21:
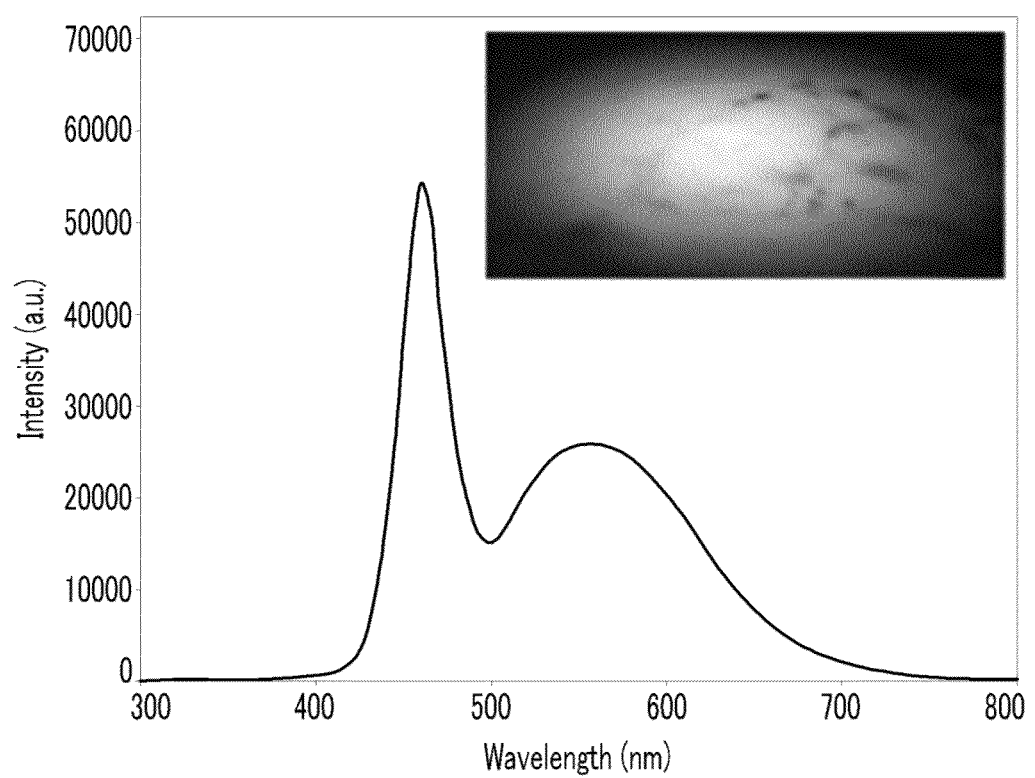
FIG. 21 is a graph showing spectrum of a light source used in this experiment and a photograph thereof.

Referring to FIG. 20 showing light receiving characteristics of the device with the phosphorescence layer under white light, the output voltage was improved. It may be because the pentacenequinone layer absorbs light and produces phosphorescence which in turn causes additional photocurrent of the photodiode. FIG. 21 is a graph showing spectrum of a light source used in this experiment and a photograph of the light source is added.

Figure 22:
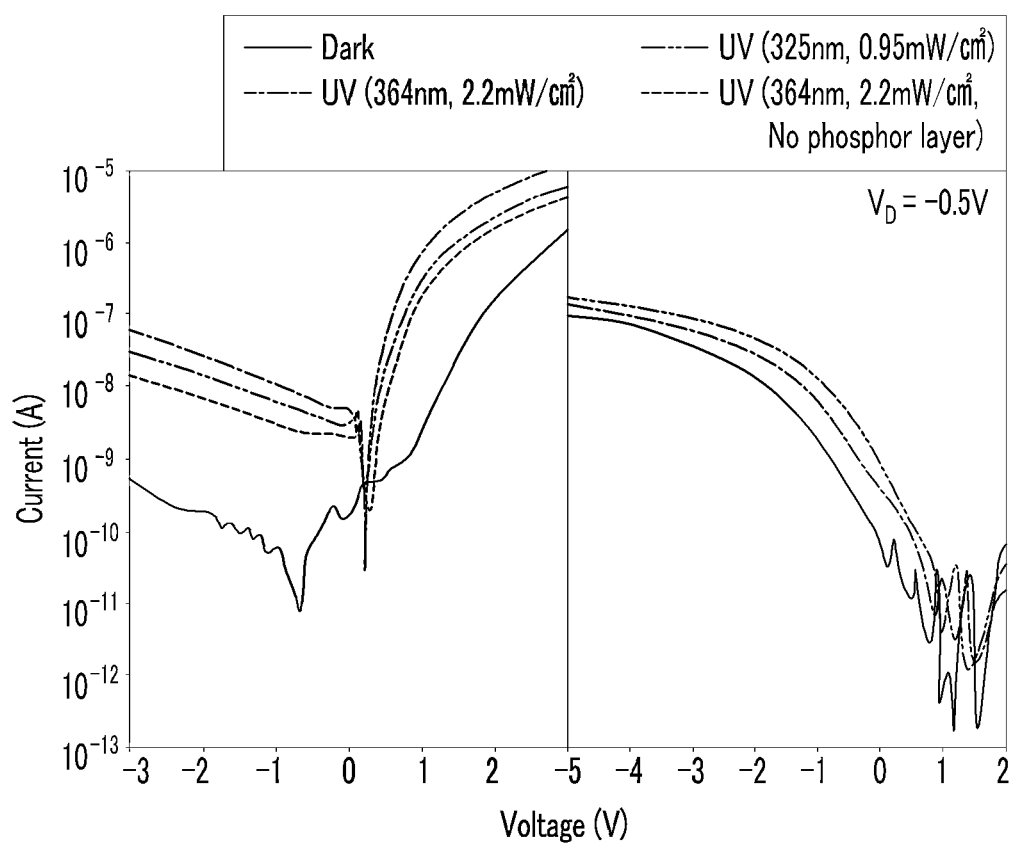
FIG. 22 and FIG. 23 show current characteristics of the photodiode and the driving transistor with and without the phosphorescence layer under UV light, and output signal characteristics of the photodiodes of the two devices under UV switching.
Figure 23:
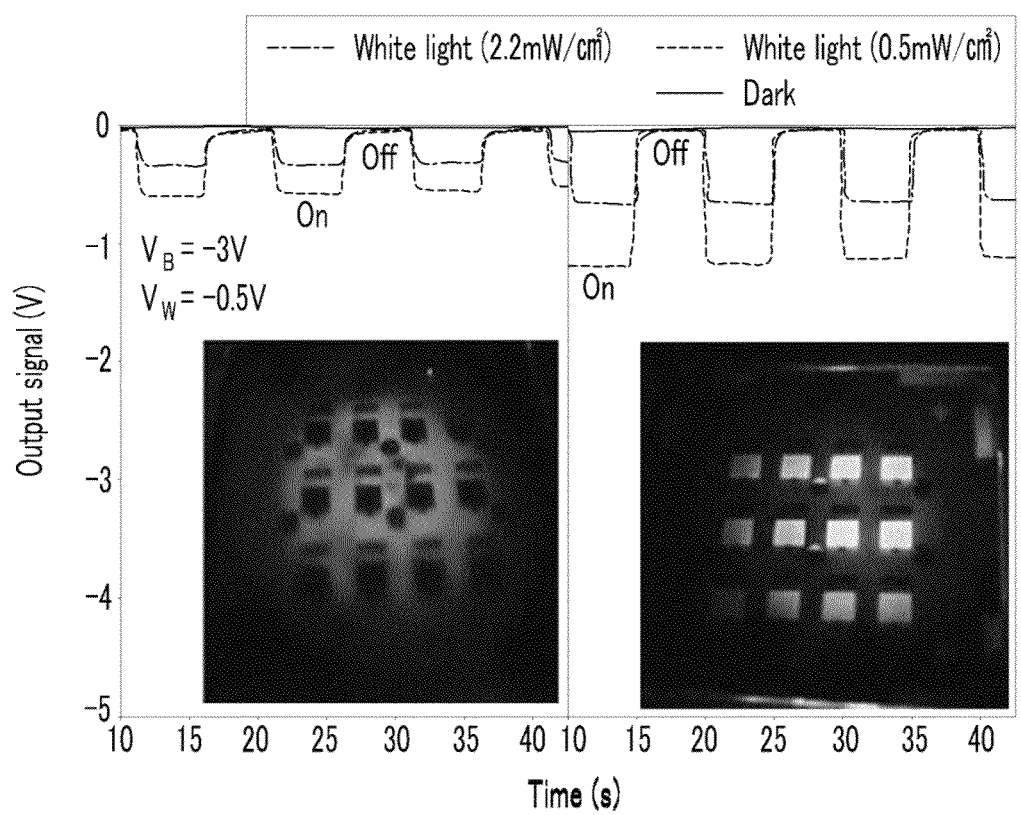

FIG. 22 and FIG. 23 show current characteristics of the photodiode and the driving transistor with and without the phosphorescence layer under UV light, and output signal characteristics of the photodiodes of the two devices under UV switching. With the phosphorescence layer, the output voltage characteristics under UV light increased about twice. It seems that the pentacenequinone phosphorescence that absorbed UV light may emit yellow light which in turn may be absorbed by the underlying photodiode, thereby improving the photo efficiency for UV light. The photographs in FIG. 23 show the devices with and without the phosphorescence layer under UV light. The device including the phosphorescence layer may emit yellow light as shown in the right side of FIG. 23. Therefore, when the devices are applied to sensors for detecting external circumstances of large-area transparent smart windows, the detection of UV light may be observed with the naked eyes as well as electrical signals.

While some example embodiments have been particularly shown and described, it will be understood by one of ordinary skill in the art that variations in form and detail may be made therein without departing from the spirit and scope of the claims.

What is claimed is:
1. A photodiode comprising:
a first electrode;
a photoelectric layer on the first electrode;
a second electrode on the photoelectric layer; and
a first phosphorescence layer on the second electrode.

2. The photodiode of claim 1, wherein
the photoelectric layer, the first and second electrodes, and the first phosphorescence layer are one of transparent and translucent.

3. The photodiode of claim 2, wherein
the first phosphorescence layer comprises pentacene-quinone.

4. The photodiode of claim 3, wherein the photoelectric layer comprises:
a p-type layer comprising a p-type organic semiconductor; and
an n-type layer comprising an n-type inorganic semiconductor,
the p-type layer and the n-type layer forming a junction.

5. The photodiode of claim 4, wherein the p-type layer comprises pentacene.

6. The photodiode of claim 5, wherein the n-type layer comprises zinc oxide (ZnO).

7. The photodiode of claim 1, further comprising:
a second phosphorescence layer, wherein
the first electrode is on the second phosphorescence layer.

8. The photodiode of claim 1, wherein
the second electrode comprises nickel oxide ($NiO_x$).

9. The photodiode of claim 8, wherein
the first electrode comprises at least one of indium-tin-oxide (ITO) and indium-zinc-oxide (IZO).

10. A photosensor comprising:
a photodiode; and a driving transistor connected to the photodiode, the photodiode including,
a first electrode,
a photoelectric layer on the first electrode,
a second electrode on the photoelectric layer; and
a first phosphorescence layer on the second electrode.

11. The photosensor of claim 10, wherein
the photodiode and the driving transistor are one of transparent and translucent.

12. The photosensor of claim 11, wherein
the first phosphorescence layer comprises pentacene-quinone.

13. The photosensor of claim 12, wherein the photoelectric layer comprises:
a p-type layer comprising a p-type organic semiconductor; and
an n-type layer comprising an n-type inorganic semiconductor,
the p-type layer and the n-type layer forming a junction.

14. The photosensor of claim 13, wherein
the p-type layer comprises pentacene.

15. The photosensor of claim 14, wherein
the n-type layer comprises zinc oxide (ZnO).

16. The photosensor of claim 15, wherein
the second electrode comprises nickel oxide ($NiO_x$).

17. The photosensor of claim 16, wherein
the first electrode comprises at least one of indium-tin-oxide (ITO) and indium-zinc-oxide (IZO).

18. The photosensor of claim 10, wherein the driving transistor comprises:
a gate electrode;
a gate insulating layer on the gate electrode;
a semiconductor layer on the gate insulating layer, the semiconductor layer comprising pentacene; and
source and drain electrodes contacting the semiconductor layer,
wherein the source electrode is connected to the first electrode.

19. The photosensor of claim 18, wherein
the gate electrode and the first electrode comprise a first material in common, and
the source and drain electrodes and the second electrode comprise a second material in common.

20. The photosensor of claim 19, wherein
the gate insulating layer comprises $AlO_x$.

* * * * *